United States Patent
Rosenbluth et al.

(10) Patent No.: US 7,844,938 B2
(45) Date of Patent: Nov. 30, 2010

(54) DATA CORRECTING HIERARCHICAL INTEGRATED CIRCUIT LAYOUT ACCOMMODATING COMPENSATE FOR LONG RANGE CRITICAL DIMENSION VARIATION

(75) Inventors: Alan E. Rosenbluth, Yorktown Heights, NY (US); Ian P. Stobert, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 257 days.

(21) Appl. No.: 12/109,400

(22) Filed: Apr. 25, 2008

(65) Prior Publication Data

US 2009/0271757 A1    Oct. 29, 2009

(51) Int. Cl.
    *G06F 17/50*    (2006.01)
(52) U.S. Cl. ............................. 716/19; 716/1
(58) Field of Classification Search ............... 716/1, 716/19
    See application file for complete search history.

(56) References Cited

U.S. PATENT DOCUMENTS

| | | | |
|---|---|---|---|
| 6,370,679 B1 | 4/2002 | Chang et al. | |
| 6,430,737 B1 | 8/2002 | Cobb et al. | |
| 6,453,452 B1 * | 9/2002 | Chang et al. | 716/8 |
| 6,883,158 B1 * | 4/2005 | Sandstrom et al. | 716/19 |
| 7,028,284 B2 | 4/2006 | Cobb et al. | |
| 7,055,126 B2 * | 5/2006 | Gallatin et al. | 716/19 |
| 7,305,651 B2 | 12/2007 | Cao | |
| 7,444,616 B2 * | 10/2008 | Sandstrom et al. | 716/21 |
| 2004/0268269 A1 * | 12/2004 | Breinberg | 715/851 |
| 2005/0216878 A1 * | 9/2005 | Word et al. | 716/21 |
| 2006/0048091 A1 * | 3/2006 | Joshi et al. | 716/21 |
| 2007/0065732 A1 * | 3/2007 | Lee et al. | 430/5 |
| 2008/0127031 A1 * | 5/2008 | Olsson et al. | 716/21 |

OTHER PUBLICATIONS

Search Report and Written Opinion of FIS920080002PCT .International Serial No. PCT/US09/39703.

* cited by examiner

*Primary Examiner*—Jack Chiang
*Assistant Examiner*—Suchin Parihar
(74) *Attorney, Agent, or Firm*—Yuanmin Cai; Hoffman Warnick LLC (57) ABSTRACT

A solution for performing a data correction on a hierarchical integrated circuit layout is provided. A method includes: receiving a CD compensation map for the long range critical dimension variation prior to the data correction; grouping compensation amounts of the CD compensation into multiple compensation ranges; generating multiple target layers corresponding to the multiple compensation ranges; super-imposing a region of the CD compensation map having a compensation amount falling into a compensation range over a respective target layer to generate a target shape; performing the data correction on the layout to generate a data corrected layout; performing the data correction on the target shape separately to generate a data corrected target shape; and combining the data corrected layout and the data corrected target shape based on the CD compensation map.

21 Claims, 8 Drawing Sheets

DATA CORRECTING HIERARCHICAL INTEGRATED CIRCUIT LAYOUT ACCOMMODATING COMPENSATE FOR LONG RANGE CRITICAL DIMENSION VARIATION

BACKGROUND

1. Technical Field

This disclosure relates generally to integrated circuit layout, and more particularly to data correcting a hierarchical integrated circuit layout with accommodation of a long range critical dimension (CD) variation of a process in manufacturing an integrated circuit based on the layout.

2. Background Art

Over the last 20-30 years, as integrated circuit features have been shrinking in size, the fundamental tools of lithography have not scaled at the same rate. For example, recent technology nodes have employed 248 nm and 193 nm wavelength light sources, forcing the need for optical imaging systems with higher numerical aperture (NA). As the resolution limits of these tools are approached, there has been an increasing discrepancy between a pattern drawn on a photo mask, and the resulting printed wafer image in resist. To address this problem, the semiconductor industry has turned to techniques for data corrections like optical proximity correction (OPC).

Modern models-based OPC includes two major components, a model and a correction algorithm. The model includes mathematical representations of the optical and resist patterning process—it can be built empirically, based on measurements of special calibration patterns printed on wafers, or based on physical principals of optics and resist chemistry. Many currently employed models involve some combination of these approaches to achieve a mathematical solution which can fairly accurately predict post-litho wafer images based on given mask shapes. The second part of OPC is the correction algorithm used to manipulate drawn circuit layouts to create a set of mask shapes. The typical inputs to this algorithm are a set of wafer target shapes (shapes representing the designer's intent on wafer, or some variation of this layout) and a model. An iterative process is employed, where shapes are manipulated through a set of edge fragment movements, and repeated use of the model to investigate how each iteration would show if printed on a wafer. The basic idea is to gradually move each fragment of the layout shape in the correct direction, so that after some finite number of iterations, the resulting mask shapes, when run through the OPC model, will result in the desired wafer image.

A common challenge faced by all of the correction techniques and algorithms is that they generally all require very large computational cost and time. The computational cost of processing data for a critical layer (like POLY) on a 32 nm processor design could easily run into tens of thousands of CPU hours. There is great interest in the industry in reducing the computational cost, and the resulting time spent in the manufacturing flow associated with mask layout data processing.

One problem with OPC processing that contributes to high computational cost is the fact that although integrated circuit (IC) layouts are designed with a significant amount of hierarchy, leaf cells are often placed in differing contexts which will behave differently when run through the OPC model. This drives the need to flatten hierarchy to some degree, in order to provide differentiated corrections to different parts of the layouts. The radius that a model "looks out" or uses for calculation of an image for a given shape is called the optical radius or Radius of Interaction (ROI). The larger the optical radius is in a model, the more adjacent shapes are taken into account in the OPC model calculations, and the greater the likelihood that two shapes at a low level in the hierarchy will need to be treated differently and pushed up (or flattened) in the OPC hierarchy. The disadvantages of "flat" OPC processing are significant, particularly when compared to efficient hierarchical processing techniques. Another disadvantage of flat processing is that the resulting mask layout design is very flat, and subsequent post OPC processing steps become very computationally expensive.

Figure 1:
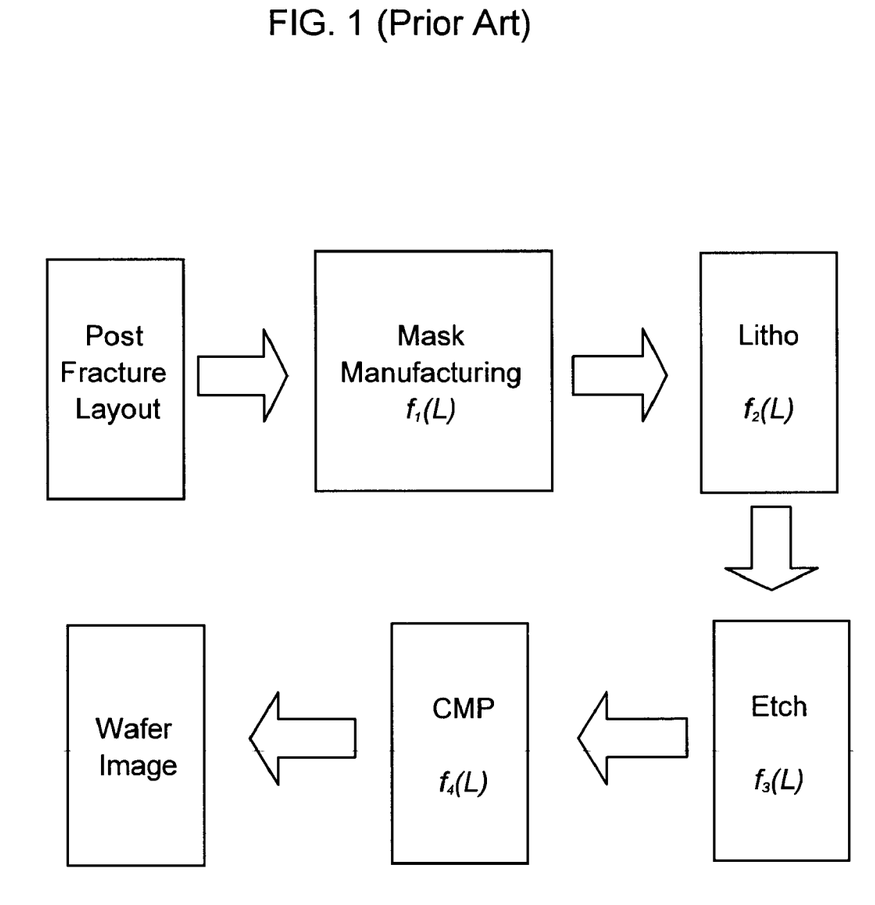
FIG. 1 shows an example of a conventional tape-out flow for processing an IC based on an IC layout.

The relative success of OPC has resulted in investigation of other semiconductor manufacturing processes and their systematic sources of variation. For example, the etch process is similar to the litho process in that one can theoretically model the etch process, and correct for systematic sources of variation by manipulating layout data in a tape-out flow, so that the mask shapes generated by etch correction and OPC correction will print uniformly and very close to the intended wafer target dimensions. FIG. 1 shows an example of a tape-out flow, where $f_n(L)$ indicates a respective model function of a step operation on layout L resulted from the immediately previous step.

With respect to systematic process variations in the tape-out flow, the ideal order to perform the corrections is in the reverse order of the corresponding processing steps. This is because corrections can be treated as performing inverse operations in the data to the effect of the process itself. For this reason, the natural place to perform corrections for long range critical dimension variation(s) like etch variations, CMP related variation, and those caused by other post-litho processing steps is before OPC in the tape-out flow (FIG. 1).

Many of the long range critical dimension (CD) variations being discussed are often thought to be pattern density related effects. Existing approaches propose correction schemes based on pattern density maps and on models which use these maps as inputs. A potential algorithm based on the existing approaches will be challenged in an attempt to establish a tape out flow connection methodology. When corrections for long range CD variations, the natural method will lead to data hierarchy flattening. If this flattening occurs before OPC, then the advantages of hierarchical OPC engines will be lost.

The technology art has often cited this as a principal barrier to performing corrections of long range CD variations in a cost efficient manner, since the penalty of data hierarchy flattening could potentially make OPC computations grow by orders of magnitude.

SUMMARY

A first aspect of the disclosure is directed to a method for performing a data correction on a hierarchical integrated circuit layout accommodating a long range critical dimension (CD) variation caused by a process in manufacturing an integrated circuit based on the layout, the method comprising: receiving a CD compensation map for the long range critical dimension variation prior to the data correction; grouping compensation amounts of the CD compensation into multiple compensation ranges; generating multiple target layers corresponding to the multiple compensation ranges; super-imposing a region of the CD compensation map having a compensation amount falling into a compensation range over a respective target layer to generate a target shape; performing the data correction on the layout to generate a data corrected layout; performing the data correction on the target shape separately to generate a data corrected target shape; and combining the data corrected layout and the data corrected target shape based on the CD compensation map.

A second aspect of the disclosure is directed to a system for performing a data correction on a hierarchical integrated circuit layout accommodating a long range critical dimension (CD) variation caused by a process in manufacturing an integrated circuit based on the layout, the system comprising: an input and output component for receive a CD compensation map for the long range critical dimension variation prior to the data correction; a CD compensation amount grouping unit for grouping compensation amounts of the CD compensation into multiple compensation ranges; a target layer generating unit for generating multiple target layers corresponding to the multiple compensation ranges; a shape combining unit for super-imposing a region of the CD compensation map having a compensation amount falling into a compensation range over a respective target layer to generate a target shape; a data correction component for performing the data correction on the layout to generate a data corrected layout and for performing the data correction on the target shape separately to generate a data corrected target shape; and a CD compensation application component for combining the data corrected layout and the data corrected target shape based on the CD compensation map.

A third aspect of the disclosure is directed to a computer program product for performing a data correction on a hierarchical integrated circuit layout accommodating a long range critical dimension (CD) variation caused by a process in manufacturing an integrated circuit based on the layout, the program product comprising computer usable program code embodied in a computer readable medium, which when executed by a computer system enables the computer system to: receive a CD compensation map for the long range critical dimension variation prior to the data correction; group compensation amounts of the CD compensation into multiple compensation ranges; generate multiple target layers corresponding to the multiple compensation ranges; super-impose a region of the CD compensation map having a compensation amount falling into a compensation range over a respective target layer to generate a target shape; perform the data correction on the layout to generate a data corrected layout; perform the data correction on the target shape separately to generate a data corrected target shape; and combine the data corrected layout and the data corrected target shape based on the CD compensation map.

A fourth aspect of the disclosure is directed to a method of providing a system for performing a data correction on a hierarchical integrated circuit layout accommodating a long range critical dimension (CD) variation caused by a process in manufacturing an integrated circuit based on the layout, the method comprising: at least one of: creating, maintaining, deploying or supporting a computer infrastructure operable to: receive a CD compensation map for the long range critical dimension variation prior to the data correction; group compensation amounts of the CD compensation into multiple compensation ranges; generate multiple target layers corresponding to the multiple compensation ranges; super-impose a region of the CD compensation map having a compensation amount falling into a compensation range over a respective target layer to generate a target shape; perform the data correction on the layout to generate a data corrected layout; perform the data correction on the target shape separately to generate a data corrected target shape; and combine the data corrected layout and the data corrected target shape based on the CD compensation map.

Other aspects and features of the present disclosure, as defined solely by the claims, will become apparent to those ordinarily skilled in the art upon review of the following non-limited detailed description of the disclosure in conjunction with the accompanying figures.

DETAILED DESCRIPTION

Embodiments of this disclosure address the issues associated with the currently used data correction techniques by providing a fast and accurate approach to compensate for long range critical dimension (CD) variations caused by a manufacturing process in a data correction operation by performing data correction process separately on the IC layout and target shapes containing CD compensations for the long range CD variations and combining the data corrected IC layout and the data corrected target shapes after the data correction process. In particular, embodiments of this disclosure calculate the critical dimension (CD) compensation(s) for the long range CD variations, generate multiple target shapes corresponding to the CD compensation(s), and perform data correction on the target shapes and the IC layout separately. In addition, embodiments of this disclosure provide an approach to perform the data correction process on the multiple target shapes in an efficient manner where the data correction solution of one target shape may be used to estimate the data correction solution of another target shape. To this extent, the data correction on the IC layout can be performed hierarchically and hence very efficiently from a computational cost standpoint and the long range CD variation is sufficiently compensated. In this disclosure, a long range CD variation refers to a systematic impact of a process that affects the final wafer critical dimensions on scales larger than the optical radius in the lithography model.

Figure 2:
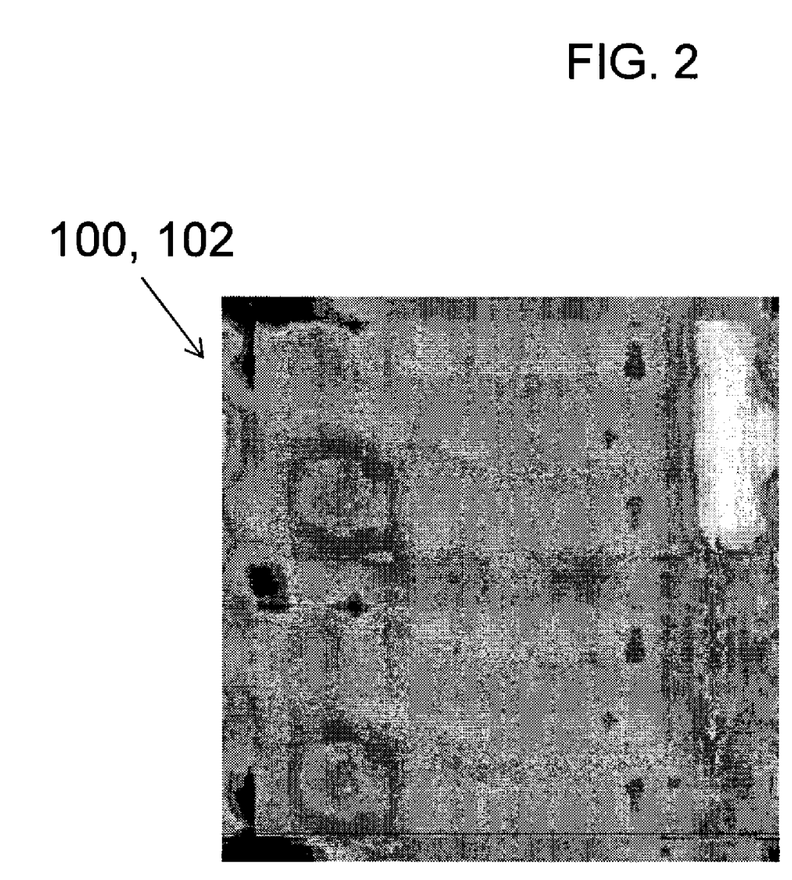
FIG. 2 shows an example of an IC layout.
Figure 3:
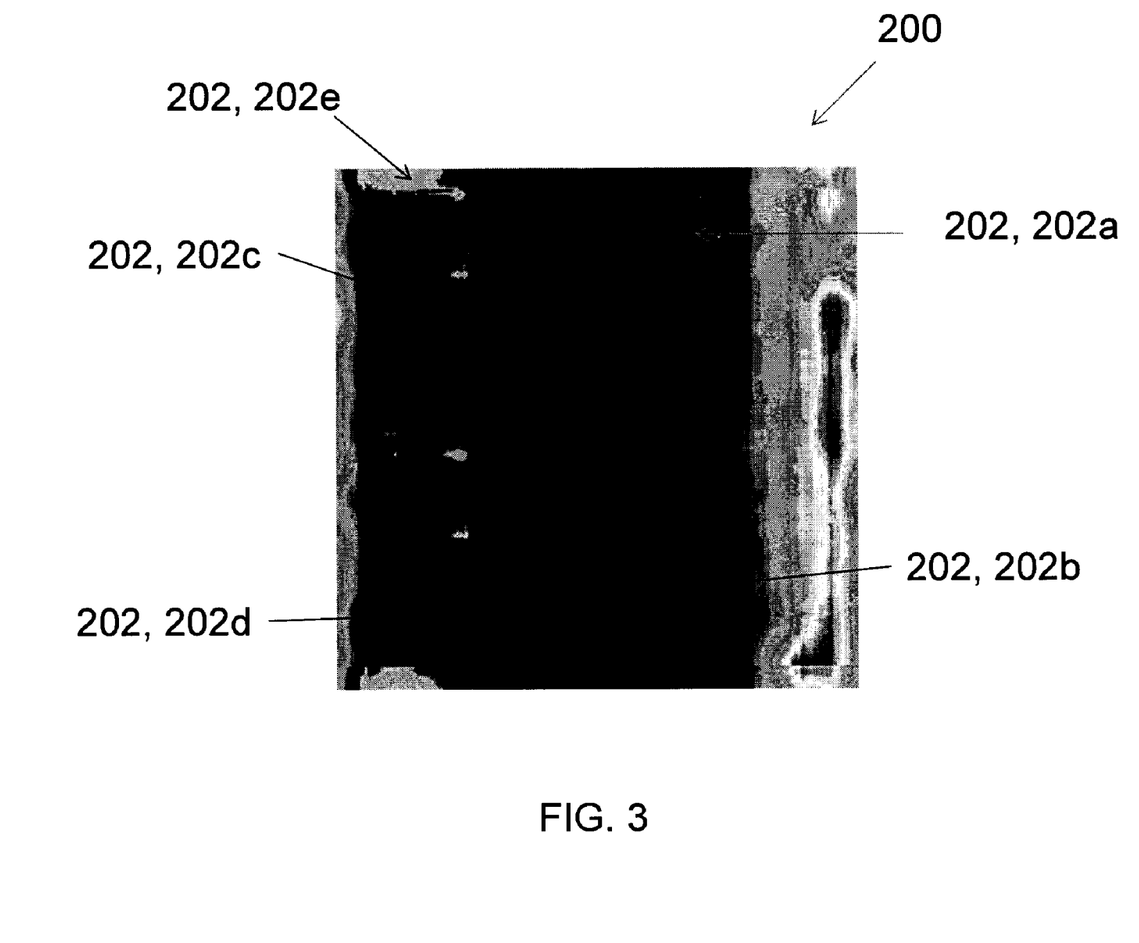
FIG. 3 shows an example of a critical dimension correction map.

As understood, a long range CD variation can be compensated by calculating a CD compensation scheme. The compensation scheme may be model(s)-based. For example, a density map of an IC layout (before a data correction process of concern) may be used to generate a CD compensation map. FIG. 2 shows a density map 102 of an example IC layout 100 (100, 102 shown together) and FIG. 3 shows a CD compensation map 200 generated based on density map 102. Note that density map 102 represents the entire layout 100 or a global portion of layout 100, the term "global" being commensurate with the long range CD variation to be compensated. That is, the area of density map 102 fully overlaps the area affected by the long range CD variation. As understood, a data correction process, e.g., OPC, may focus on a small portion of layout 100, e.g., an OPC cell, instead of the complete layout or the global portion thereof. Note that OPC involves calculations that only need to take into account the localized context of any shape being corrected. In the description herein, a critical dimension (CD) correction refers to the correction used to compensate the long range CD variation of a manufacturing process of interest, e.g., an etch or a chemical mechanical polishing process, and data correction refers to the correction of layout/mask data other than the CD compensation.

As understood, CD compensation of different features on an IC layout may be different as different features may include different critical dimensions/densities and thus may involve different CD variation amounts. In FIG. 3, the areas 202 of different darkness represent different CD compensation amounts. The following description of the embodiment(s) is illustratively based on density map 102 and CD compensation map 200. However, the creation of CD compensation map 200 is not an essential element of the embodiments. To this extent, layout 100, density map 102 and/or CD compensation map 200 may be provided for the operation of the embodiments of the disclosure.

Figure 4:
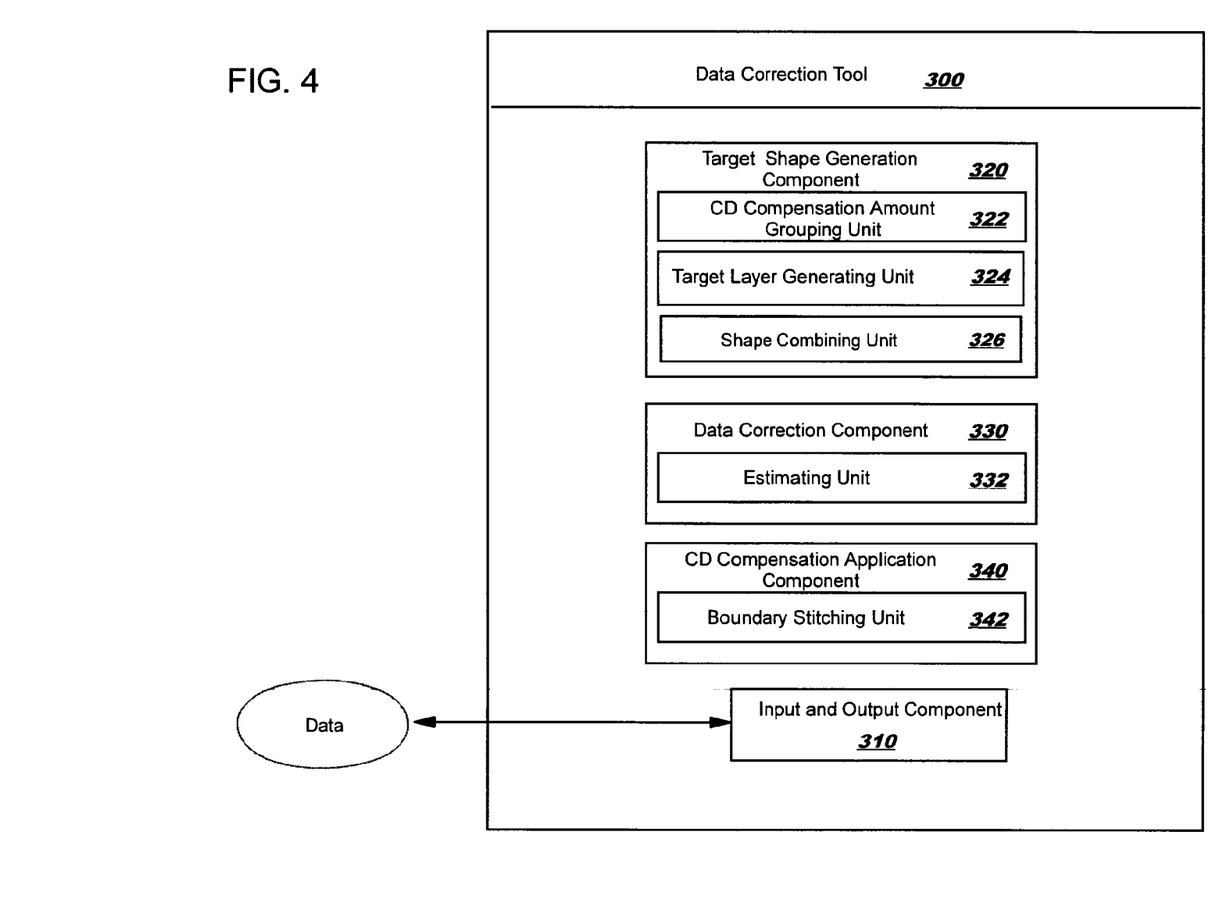
FIG. 4 shows a schematic block diagram of a data correction tool used to perform data correction on an IC layout.

FIG. 4 shows a schematic block diagram of a data correction tool 300 used to perform a data correction on IC layout 100 accommodating the compensation for a long range CD variation of a manufacturing process. Data correction tool 300 comprises an input/output component 310 configured to receive input and output data. In particular, input/output component 310 is configured to receive information on IC layout 100, density map 102, CD compensation map 200, a tape-out process flow for manufacturing an IC based on layout 100, and/or user instructions as may be required in the operation of data correction tool 300. Input/output component 310 is also configured to output results from the data correction operation. These results can be used to revise layout 100 for use in manufacturing an IC device.

Data correction tool 300 further comprises a target shape generation component 320, a data correction component 330, and a CD compensation application component 340. Target shape generation component 320 may be configured to generate multiple target shapes based on a provided CD compensation map 200 and IC layout 100. In particular, target shape generation components 320 may further include a CD compensation amount grouping unit 322, a target layer generating unit 324, and a shape combining unit 326. CD compensation amount grouping unit 322 may be configured to group the CD compensation amounts of CD compensation map 200 into multiple ranges and may choose a bucket value for each range. Target layer generating unit 324 may be configured to create multiple target layers corresponding to the CD compensation amount ranges. Shape combining unit 326 may be configured to superimpose a region of CD compensation map 200 having a CD compensation amount falling into a CD compensation range over a respective target layer to generate a target shape. Note that each target layer corresponds to a specific CD compensation amount range such that a region in CD compensation map 200 can be superimposed over a corresponding target layer. A target layer may correspond to multiple CD compensation map 200 regions.

Data correction component 330 may be configured to perform a data correction operation on IC layout 100 and/or a target shape generated by target shape generation component 320. Data correction component 330 may use/implement any now available or later developed data correction method. Further, data correction component 330 includes an estimating unit 332 which is configured to estimate a data correction solution for a first target shape based on a data correction solution for a second different target shape.

CD compensation application component 340 may be configured to apply the CD compensation(s) onto IC layout 100 after IC layout 100 is data corrected. Further, CD compensation application component 340 may include a boundary stiching unit 342 configured to stitch the boundaries between and among multiple target shapes and IC layout 100. Stitching refers to reconciling difference(s) in shape manipulation recipes on the boundaries of two adjacent regions such that these independently calculated solutions meet/combine together substantially seamlessly at these boundary regions Although not expressly shown in FIG. 4, all of the components shown in the figure are configured to interact with one another.

Figure 5:
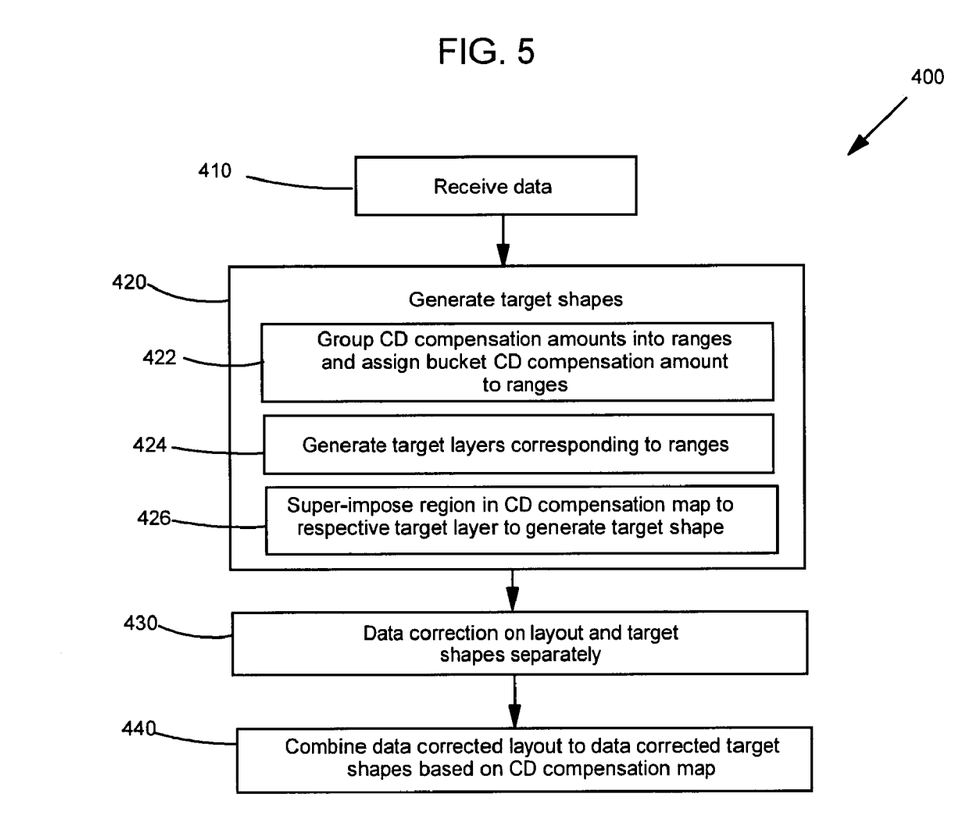
FIG. 5 shows a flow diagram of an example of an operation of the data correction tool of FIG. 4.

FIG. 5 shows an example of a flow chart 400 describing a data correction operation performed by data correction tool 300 on IC layout 100, which accommodates the compensation for a long range CD variation caused by a manufacturing process. According to an embodiment, the disclosure applies to the situation that the manufacturing process occurs after the data correction operation such that the long range CD variation caused by the manufacturing process needs to be considered before the data correction operation. In the description here, an OPC operation is used as an example of the data correction, and an etch process is used as an example of the manufacturing process that causes a long range CD variation.

The operation begins at process block 410 where data is provided to/received by input/output component 310. The required data may include original layout 100, model density based model functions of each step of the tape-out process which may include but are not limited to mask manufacturing, lithography, etching, or CMP. In addition, CD compensation for the long range CD variation of the etch process is also provided For example, CD compensation map 200 is provided. It is also possible that data correction tool 300 includes a component for generating CD compensation map 200 based on a provided IC layout 100 and the model function of the etch process. However, the generation of the CD compensation map 200 does not limit the current disclosure, nor is it required for an understanding of the current disclosure. To this extent, no further explanation of the generation of CD compensation map 200 will be provided.

Next in FIG. 5 is the target shape generation process run at process block 420. The target shape generation process 420 may include multiple sub-processes. In sub-process 422, CD compensation amount grouping unit 322 groups the amounts of CD compensations for the long range CD variation into multiple correction ranges. Basically, the compensation amount ranges can be selected based on use model/user instructions. Preferably, the ranges need to be selected with sufficient granularity such that the required wafer CD specification(s) can be achieved, yet with sufficient coarseness to reduce the computational cost of the OPC calculations. Essentially, the selection is a trade-off between run-time efficiency and the accuracy of correction (or accuracy of wafer CDs). For illustrative purposes, it is assumed that CD compensation amounts of region(s) 202a fall into range −5 nm to −3 nm, region(s) 202b falls into range −3 nm to −1 nm, region(s) 202c falls into range 1 nm to 3 nm, region(s) 202d falls into range 3 nm to 5 nm, and region(s) 202e falls into range −1 nm to 1 nm (FIG. 3).

Further in subprocess 422, CD compensation amount grouping unit 322 may select a bucket CD compensation amount for each CD compensation range. The bucket CD compensation amount is essentially a "round-off" value selected among the CD compensation amounts included in the respective CD compensation range. Any "rounding off" scheme may be used and none limits the scope of the disclosure. For example, for a CD compensation range of 1 nm to 3 nm, the bucket CD compensation amount (round-off value) may be the average, i.e., 2 nm, the upper end, i.e., 3 nm or the lower end, i.e., 1 nm. For illustrative purposes, it is assumed that a bucket CD compensation amount of −4 nm is assigned to range −5 nm to −3 nm, −2 nm is assigned to range −3 nm to −1 nm, 2 nm is assigned to range 1 nm to 3 nm, 4 nm is assigned to range 3 nm to 5 nm, and 0 nm (no CD compensation) is assigned to range −1 nm to 1 nm.

Figure 6:
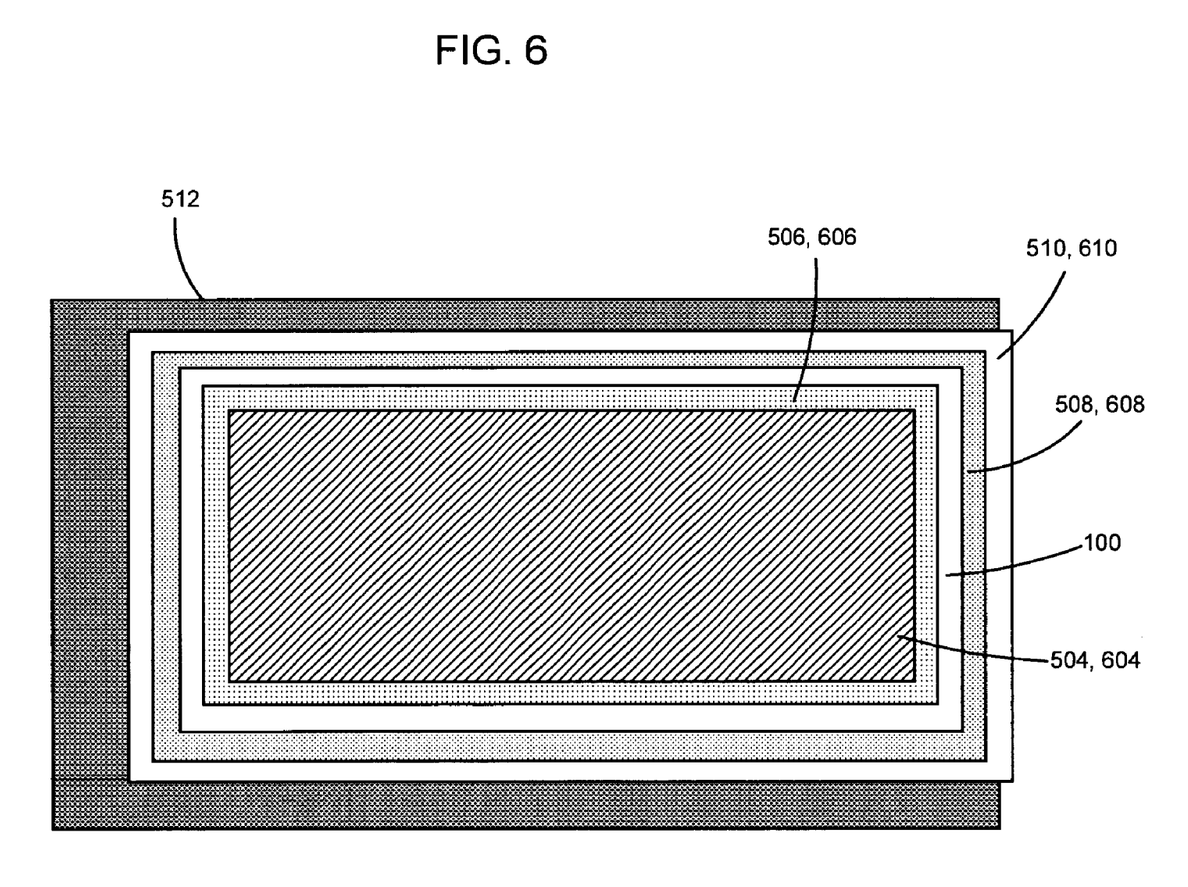
FIG. 6 shows examples of an IC layout with target layers and target shapes.

In sub-process 424, target layer generating unit 324 generates multiple target layers corresponding to the multiple CD compensation amount ranges. The target layer may be created based on the original IC layout 100 that is subject to OPC. For a CD compensation amount range with a 0 nm bucket CD compensation amount, e.g., range −1 nm to 1 nm, no additional target layer is required as no CD compensation is required, or the target layer is the same as IC layout 100 (IC layout 100 can be treated as a special example of a target layer). However, an additional target layer for the zero amount CD compensation may be included and is within the scope of the disclosure. According to an embodiment, a size of a target layer is different than a size of the original IC layout 100 by an amount determined based on the CD compensation amount range of the target layout, e.g., the bucket CD compensation amount. For example, a first target layer corresponding to a CD compensation range 3 nm to 5 nm with a bucket CD compensation amount of 4 nm may be larger (in each dimension) than the original IC layout 100 by 4 nm; and a second target layer corresponding to a CD compensation range −1 nm to −3 nm with a bucket CD compensation amount of −2 nm may be smaller than the original IC layout 100 by 2 nm. FIG. 6 shows examples of IC layout 100 with target layers 504, 506, 508 and 510. Target layers 504 and 506 correspond to bucket CD compensation amounts −2 nm and −4 nm, respectively, and are smaller than IC layout 100 by 2 nm and 4 nm, respectively. Target layers 508 and 510 correspond to bucket CD compensation amounts 2 nm and 4 nm, respectively, and are larger than IC layout 100 by 2 nm and 4 nm, respectively. FIG. 6 also shows area 512 of the whole mask solution. As shown in FIG. 6, some target layers, here layer 510, may be larger than the whole mask solution area 512 in some dimension(s).

In sub-process 426, shape combining unit 326 superimposes a region 202 of CD compensation map 200 having a CD compensation amount falling into a CD compensation amount range over the respective target layer, i.e., the target layer corresponding to the CD compensation amount range, to generate a target shape. For example, as region 202c includes a CD compensation amount of 2 nm which falls into the 1 nm-3 nm range having a bucket CD compensation amount of 2 nm, region 202c will be superimposed over target layer 508. According to an embodiment, in the super-imposing, the region 202, e.g., region 202c, in the CD compensation map 200 will be assigned/flattened with the bucket CD compensation amount, here 2 nm, to form a target shape. As a consequence, the resulting target shape includes all regions 202c that fall into the 1 nm to 3 nm range, which all now have a CD compensation amount (bucket) of 2 nm. Sub-process 426 generates multiple target shapes 604, 606, 608, 610 corresponding to the multiple target layers 504, 506, 508, 510 (shown together in FIG. 6). For regions 202e that have zero bucket CD compensation amount, no target shape is generated as no CD compensation is required. Alternatively, a target shape of zero CD compensation amount may be generated which is included in the scope of the disclosure.

At process block 430, data correction component 330 runs data correction operation on the original IC layout 100 and each of the multiple target shapes 604, 606, 608, 610 separately. The OPC on IC layout 100 may be performed on any now known or later develop method, which does not limit the scope of the disclosure. It is understood that because CD compensation has not been applied, the OPC on the original IC layout 100 may be performed without adversely affecting the hierarchy of the layout any worse than OPC would without accommodating long range CD compensation(s). The OPC on a target shape may also be performed with any now known or later developed method. However, according to an embodiment, an efficient way may be used to estimate OPC solutions of targets shapes using the available image parameters of each target shape. Specifically, estimating unit 332 performs the estimation operation.

Figure 7:
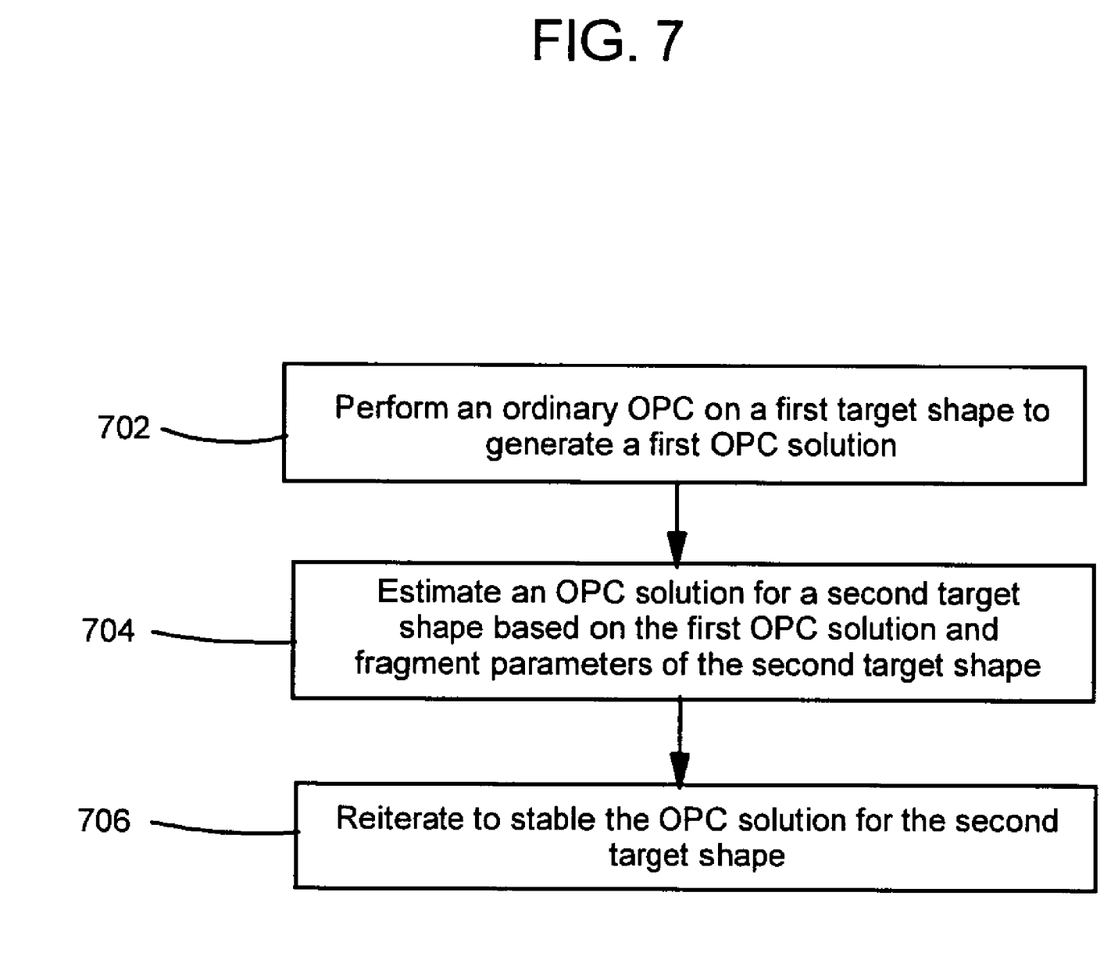
FIG. 7 shows a flow diagram of an example of an OPC operation on target shapes.

FIG. 7 shows embodiments of OPC operations on target shapes 604, 606, 608, 610 including the estimation operation. At block 702, data correction component 330 performs a normal (i.e., not an estimation) OPC operation on one of the target shapes, e.g., target shape 608 (FIG. 6), through normal number of iterations, e.g., 8 iterations, to get an (first) OPC solution. At block 704, estimating unit 332 estimates a (second) data correction solution for another target shape, e.g., target shape 610, using the (first) OPC solution for target shape 608 and the available image parameter(s) thereof. One example of an image parameter that can be used to roughly estimate the correction solution needed is Mask Error Factor (MEEF). Another parameter is "slope of the aerial image perpendicular to the threshold contour". One skilled in the art would understand how to translate this information into a fragment placement correction scheme. At block 706, estimating unit 332 and data correction component 330 coordinate to iterate the estimating, e.g., once or twice, to stabilize the (second) OPC solution for target shape 610. The similar estimating may be performed on all other target shapes 604 and 606.

At process block 440 (FIG. 5), CD compensation application component 340 combines the data corrected layout 100 and data corrected target shapes 604, 606, 608 and 610 based on CD compensation map 200. This combination can be done any time after OPC, when the penalty for data flattening is small. Mask fracture is one example of a place in the flow where the cost of applying this CD compensation would be very low, because the data is completely flat in fracture.

Specifically, for an OPC cell on IC layout 100, CD compensation application component 340 may select one respective data corrected (OPC solution) target shape to combine with IC layout 100. The selection is based on CD compensation map 200. For example, assume an OPC cell in layout 100 corresponds to a region having CD compensation amount 5 nm in CD compensation map 200. CD correction amount of 5 nm corresponds to bucket CD compensation amount 4 nm and target shape 610. As such, for this specific OPC cell, IC layout 100 will be combined with target shape 610. Similarly, for each OPC cell on IC layout 100, there may be at most one data corrected target shape (may be zero if the cell corresponds to a CD compensation range with zero bucket CD compensation amount) to be combined with. As understood, at this stage, the mask structure of IC layout 100 is already relatively flat and the combination, i.e., application of the CD compensations, will not incur any additional penalties on computing resources.

The boundary areas where two or more target shapes (OPC solutions) meet may be stitched together by boundary stitching unit 342 using any now available or later developed method.

The foregoing flow chart shows some of the processing functions associated with performing a data correction operation on an IC layout, which accommodates a compensation for long range CD variation(s) caused by a manufacturing process. In this regard, each block represents a process act associated with performing these functions. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe the processing functions may be added.

Figure 8:
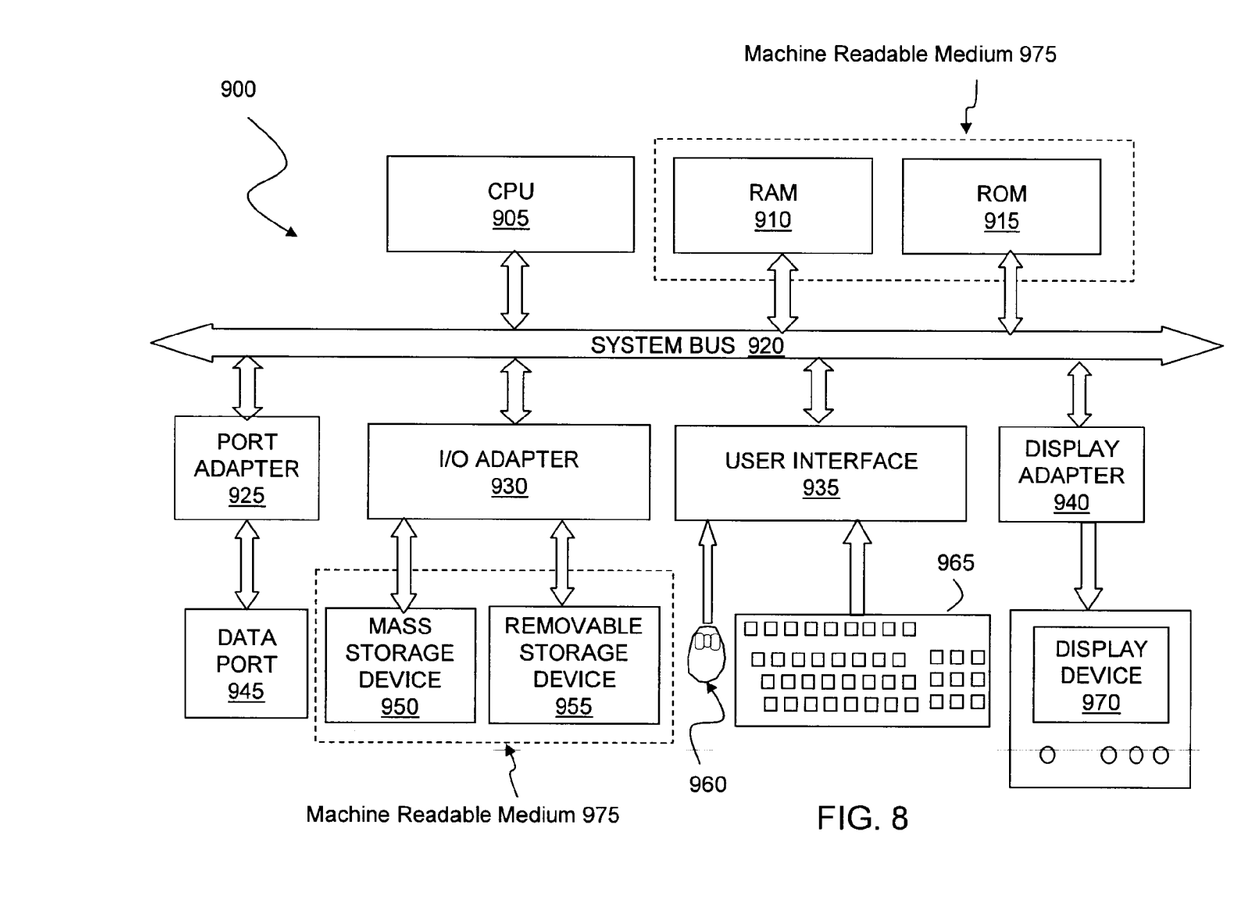
FIG. 8 shows a general computer system.

FIG. 8 depicts a block diagram of a general-purpose computer system 900 that can be used to implement data correction tool 300. Data correction tool 300 may be coded or deployed as a set of instructions on removable or hard media for use by the general-purpose computer 900. The computer system 900 has at least one microprocessor or central processing unit (CPU) 905. The CPU 905 is interconnected via a system bus 920 to machine readable media 975, which includes, for example, a random access memory (RAM) 910, a read-only memory (ROM) 915, a removable and/or program storage device 955, and a mass data and/or program storage device 950. An input/output (I/O) adapter 930 connects mass storage device 950 and removable storage device 955 to system bus 920. A user interface 935 connects a keyboard 965 and a mouse 960 to the system bus 920, a port adapter 925 connects a data port 945 to the system bus 920, and a display adapter 940 connects a display device 970 to the system bus 920. The ROM 915 contains the basic operating system for computer system 900. Examples of removable data and/or program storage device 955 include magnetic media such as floppy drives, tape drives, portable flash drives, zip drives, and optical media such as CD ROM or DVD drives. Examples of mass data and/or program storage device 950 include hard disk drives and non-volatile memory such as flash memory. In addition to the keyboard 965 and mouse 960, other user input devices such as trackballs, writing tablets, pressure pads, microphones, light pens and position-sensing screen displays may be connected to user interface 935. Examples of the display device 970 include cathode-ray tubes (CRT) and liquid crystal displays (LCD).

A machine readable computer program may be created by one of skill in the art and stored in computer system 900 or a data and/or any one or more of machine readable medium 975 to simplify the practicing of this disclosure. In operation, information for the computer program created to run the present disclosure is loaded on the appropriate removable data and/or program storage device 955, fed through data port 945, or entered using keyboard 965. A user controls the program by manipulating functions performed by the computer program and providing other data inputs via any of the above mentioned data input means. The display device 970 provides a way for the user to accurately control the computer program and perform the desired tasks described herein.

Computer readable media can be any available media that can be accessed by a computer. By way of example, and not limitation, computer readable media may comprise "computer storage media" and "communications media."

"Computer storage media" include volatile and non-volatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

"Communication media" typically embodies computer readable instructions, data structures, program modules, or other data in a modulated data signal, such as carrier wave or other transport mechanism. Communication media also includes any information delivery media.

The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above are also included within the scope of computer readable media.

3. Conclusion

While shown and described herein as a method and system for performing a data correction on a hierarchical integrated circuit layout, it is understood that the disclosure further provides various alternative embodiments. For example, in an embodiment, the disclosure provides a program product stored on a computer-readable medium, which when executed, enables a computer infrastructure to perform a data correction on a hierarchical integrated circuit layout. To this extent, the computer-readable medium includes program code, such as data correction tool 300 (FIG. 4), which implements the process described herein. It is understood that the term "computer-readable medium" comprises one or more of any type of physical embodiment of the program code.

It should be appreciated that the teachings of the present disclosure could be offered as a business method on a subscription or fee basis. For example, a computer system 900 (FIG. 8) comprising data correction tool 300 (FIG. 4) could be created, maintained and/or deployed by a service provider that offers the functions described herein for customers. That is, a service provider could offer to provide a service to perform a data correction on a hierarchical IC layout as described above.

As used herein, it is understood that the terms "program code" and "computer program code" are synonymous and mean any expression, in any language, code or notation, of a set of instructions that cause a computing device having an information processing capability to perform a particular function either directly or after any combination of the following: (a) conversion to another language, code or notation; (b) reproduction in a different material form; and/or (c) decompression. To this extent, program code can be embodied as one or more types of program products, such as an application/software program, component software/a library of functions, an operating system, a basic I/O system/driver for a particular computing and/or I/O device, and the like. Further, it is understood that the terms "component" and "system" are synonymous as used herein and represent any combination of hardware and/or software capable of performing some function(s).

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the disclosure has other applications in other environments. This application is intended to cover any adaptations or variations of the present disclosure. The following claims are in no way intended to limit the scope of the disclosure to the specific embodiments described herein.

It is apparent that there has been provided by this invention an approach for performing data correction operation on an IC layout accommodating compensation for CD variations. While the invention has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A method for performing a data correction on a hierarchical integrated circuit layout accommodating a long range critical dimension (CD) variation caused by a process in manufacturing an integrated circuit based on the layout, the method comprising:
    receiving a CD compensation map for the long range critical dimension variation prior to the data correction;
    grouping compensation amounts of the CD compensation into multiple compensation ranges;
    generating multiple target layers corresponding to the multiple compensation ranges using a computer;
    super-imposing multiple regions of the CD compensation map having a compensation amount falling into a compensation range over respective target layers based on the respective compensation ranges to generate multiple target shapes;
    performing the data correction on the layout to generate a data corrected layout;
    performing the data correction on the multiple target shapes separately from the data corrected layout to generate multiple data corrected target shapes; and
    combining the data corrected layout and the multiple data corrected target shapes based on the CD compensation map.

2. The method according to claim 1, further comprising assigning a bucket CD compensation amount for each compensation range.

3. The method according to claim 2, wherein the super-imposing includes flattening the region with the bucket CD compensation amount.

4. The method according to claim 1, the data correcting of the multiple target shapes includes:
    performing a data correction on a first target shape among the multiple target shapes to generate a first data correction solution; and
    estimating a second data correction solution for a second target shape based on the first data correction solution and an image parameter of a fragment on the second target shape; and
    iterating the estimating to stabilize the second data correction solution for generating a data corrected target shape for the second target shape.

5. The method according to claim 4, wherein the image parameter includes at least one of a Mask Error Factor or a slope of aerial image perpendicular to a threshold contour of the fragment.

6. The method according to claim 1, wherein for a cell for the data correction on the layout, the combining includes selecting one of the multiple data corrected target shapes to combine with the layout based on a region on the CD compensation map corresponding to the cell.

7. The method according to claim 1, wherein a size of a target layer is different than a size of the layout by an amount determined based on the respective compensation range.

8. The method according to claim 1, wherein the received CD compensation map is generated based on a density map of the layout using a model.

9. The method according to claim 1, wherein the data correction includes an optical proximity correction and the process in manufacturing includes at least one of an etching process or a chemical mechanical polishing process.

10. The method according to claim 1, wherein the manufacturing process is scheduled to occur after the data correction.

11. A system for performing a data correction on a hierarchical integrated circuit layout accommodating a long range critical dimension (CD) variation caused by a process in manufacturing an integrated circuit based on the layout, the system comprising:
    an input and output component for receive a CD compensation map for the long range critical dimension variation prior to the data correction;
    a CD compensation amount grouping unit for grouping compensation amounts of the CD compensation into multiple compensation ranges;
    a target layer generating unit for generating multiple target layers corresponding to the multiple compensation ranges;
    a shape combining unit for super-imposing multiple regions of the CD compensation map having a compensation amount falling into a compensation range over respective target layers based on the respective compensation ranges to generate multiple target shapes;
    a data correction component for performing the data correction on the layout to generate a data corrected layout and for performing the data correction on the multiple target shapes separately from the data corrected layout to generate multiple data corrected target shapes; and
    a CD compensation application component for combining the data corrected layout and the multiple data corrected target shapes based on the CD compensation map.

12. The system according to claim 11, wherein the CD compensation amount grouping unit further assigns a bucket CD compensation amount for each compensation range.

13. The system according to claim 12, wherein the shape combining unit flattens the region with the bucket CD compensation amount in the super-imposing.

14. The system according to claim 11, wherein for a cell for the data correction on the layout, the CD compensation application component selects one of the multiple data corrected target shapes to combine with the layout based on a region on the CD compensation map corresponding to the cell.

15. A computer program product for performing a data correction on a hierarchical integrated circuit layout accommodating a long range critical dimension (CD) variation caused by a process in manufacturing an integrated circuit based on the layout, the program product comprising computer usable program code embodied in a non-transitory computer readable medium, which when executed by a computer system enables the computer system to:
    receive a CD compensation map for the long range critical dimension variation prior to the data correction;
    group compensation amounts of the CD compensation into multiple compensation ranges;
    generate multiple target layers corresponding to the multiple compensation ranges;

super-impose multiple regions of the CD compensation map having a compensation amount falling into a compensation range over respective target layers based on the respective compensation ranges to generate multiple target shapes;

perform the data correction on the layout to generate a data corrected layout;

perform the data correction on the multiple target shapes separately from the data corrected layout to generate multiple data corrected target shapes; and combine the data corrected layout and the multiple data corrected target shapes based on the CD compensation map.

16. The program product according to claim 15, wherein the program code is further configured to enable the computer system to assign a bucket CD compensation amount for each compensation range.

17. The program product according to claim 16, wherein the program code is further configured to enable the computer system to flatten the region with the bucket CD compensation amount in the super-imposing.

18. The program product according to claim 15, wherein for a cell for the data correction on the layout, the program code is further configured to enable the computer system to select one of the multiple data corrected target shapes to combine with the layout based on a region on the CD compensation map corresponding to the cell.

19. A method of providing a system for performing a data correction on a hierarchical integrated circuit layout accommodating a long range critical dimension (CD) variation caused by a process in manufacturing an integrated circuit based on the layout, the method comprising:

at least one of: creating, maintaining, deploying or supporting a computer infrastructure operable to:

receive a CD compensation map for the long range critical dimension variation prior to the data correction;

group compensation amounts of the CD compensation into multiple compensation ranges;

generate multiple target layers corresponding to the multiple compensation ranges using a computer;

super-impose multiple regions of the CD compensation map having a compensation amount falling into a compensation range over respective target layers based on the respective compensation ranges to generate multiple target shapes;

perform the data correction on the layout to generate a data corrected layout;

perform the data correction on the multiple target shapes separately from the data corrected layout to generate multiple data corrected target shapes; and combine the data corrected layout and the multiple data corrected target shapes based on the CD compensation map.

20. The method according to claim 19, wherein the computer infrastructure is further operable to assign a bucket CD compensation amount for each compensation range and wherein the computer infrastructure is further operable to flatten the region with the bucket CD compensation amount in the super-imposing.

21. The method according to claim 19, wherein for a cell for the data correction on the layout, the computer infrastructure is further operable to select one of the multiple data corrected target shapes to combine with the layout based on a region on the CD compensation map corresponding to the cell.

* * * * *